(12) United States Patent
Face, Jr.

(10) Patent No.: US 6,245,172 B1
(45) Date of Patent: Jun. 12, 2001

(54) METHOD AND APPARATUS FOR MANUFACTURING MULTI-LAYERED HIGH DEFORMATION PIEZOELECTRIC ACTUATORS AND SENSORS

(75) Inventor: Samuel A. Face, Jr., Norfolk, VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/383,697

(22) Filed: Aug. 26, 1999

(51) Int. Cl.⁷ ........................................ B32B 31/00
(52) U.S. Cl. ..................... 156/89.11; 156/89.12; 156/269
(58) Field of Search ................ 156/73.1, 89.11, 156/89.12, 250, 269, 290, 292, 324

(56) References Cited

U.S. PATENT DOCUMENTS 5,471,721 * 12/1995 Haertling .......................... 29/25.35
5,632,841 * 5/1997 Hellbaum et al. .................. 156/245

* cited by examiner

*Primary Examiner*—James Sells
(74) *Attorney, Agent, or Firm*—Stephen E. Clark; David J. Bolouc

(57) ABSTRACT

A method for manufacturing high deformation piezoelectric actuators and sensors using a continuous tape manufacturing process is provided. The ceramic layer is dispensed between two metal/adhesive layers to form a composite tape and is tack welded together. Lengths of composite tape are heated and then cut into individual actuators. A special pattern punched in the tapes allows for ease of alignment of the layers of the actuators.

7 Claims, 7 Drawing Sheets

METHOD AND APPARATUS FOR MANUFACTURING MULTI-LAYERED HIGH DEFORMATION PIEZOELECTRIC ACTUATORS AND SENSORS

BACKGROUND OF THE INVENTION

1. Field of the Invention

The present invention relates to a method and apparatus for manufacturing piezoelectric devices. More particularly, the present invention is directed to an automated, high-volume method and apparatus for manufacturing multi-layered high deformation piezoelectric actuators and sensors.

2. Description of the Prior Art

The present invention is a unique method and apparatus for automatically manufacturing piezoelectric actuators and sensors, principally pre-stressed high deformation actuators and sensors. The disclosed invention provides a method of manufacturing high deformation actuators which is fast, reliable, precise and easy as compared with prior manufacturing methods.

Piezoelectric materials change shape when a voltage potential is applied across their faces. Piezoelectric materials used in conventional configurations have limited application because of the relatively small amount of displacement which the piezoelectric material undergoes during electrical excitation. In order to increase the amount of displacement which can be developed by the piezoelectric material (typically a thin ceramic wafer) the material may be "pre-stressed", such that the ceramic wafer is normally under compression when unenergized. Prior methods of pre-stressing the ceramic wafer include bonding a metallic foil (for example aluminum, stainless steel or the like), under tension, to a major face of the ceramic wafer with an adhesive, thus creating what is known as "THUNDER" (THin layer composite UNimorph ferroelectric Driver and sEnsoR) as disclosed in U.S. Pat. No. 5,632,841. Other methods, such as the "Rainbow" method as disclosed in U.S. Pat. No. 5,471,721, use a chemical reduction process to pre-stress the ceramic wafer. The present invention provides a method and apparatus for producing pre-stressed piezo-electric actuators such as THUNDER and the like. The following disclosure principally describes the preferred embodiment of the invention and its use in manufacturing THUNDER. It will be understood, however, that the present invention, or modifications thereof, may be used to manufacture other types of multi-layer piezoelectric actuators and sensors.

Prior methods of manufacturing THUNDER include inefficient, low output methods which rely heavily on human labor. The most common prior method of manufacturing THUNDER actuators is as follows: THUNDER actuators are constructed in a "sandwich" configuration with each actuator having a plurality of layers, including first and second metal pre-stress layers, first and second adhesive layers, and a PZT ceramic wafer having electrodes disposed on both of its major faces. Initially, all of the layers are manually cut to their desired shape. A razor blade or similar instrument is used to cut the ceramic wafer; and a paper cutter, scissors or a razor blade is typically used to cut the adhesive and metal pre-stress layers to size.

Before the "sandwich" can be assembled, the two major faces of the ceramic wafer, one major face of the first metal pre-stress layer and one major face of the second metal pre-stress layer are sprayed with a primer coating of a thermoplastic adhesive, such as "LaRC-SI", using an air brush or the like. LaRC-SI is a soluble imide developed by the National Aeronautics and Space Administration that is manufactured by NASA in accordance with the process disclosed in U.S. Pat. No. 5,639,850. Initially, one side of the ceramic wafer is sprayed with LaRC-SI. The coated ceramic wafers are placed on a release cloth-covered aluminum tray. The aluminum tray, release cloth and ceramic wafers are placed in an oven at approximately 70 deg. C., where they remain until the LaRC-SI dries. The tray and its contents are subsequently removed from the oven, and the LaRC-SI coating process is repeated a second time for the same side of the ceramic wafer. After the second coat is dry, the ceramic wafers are turned over and two coats of LaRC-SI adhesive are applied to the opposing major face using the above described process. The same process is then repeated for the first and second metal pre-stress layers, however only one major face of the metal pre-stress layers is coated. Because LaRC-SI is a dielectric, and in a finished THUNDER actuator the adhesive layer is disposed between a metal pre-stress layer and the ceramic wafer, it is sometimes necessary to roughen a major face of the metal prestress layers using sandpaper so that intermittent electrical contact is made between the metal prestress layers and the electrodes.

After the LaRC-SI coating on the ceramic wafers and the first and second metal pre-stress layers are dry, the "sandwich" is ready for assembly. The first metal pre-stress layer, which is usually the bottom layer in the "sandwich", typically comprises steel, stainless steel, beryllium alloy or other metal. Placed adjacent the first pre-stress layer in the "sandwich" is the first adhesive layer which is typically LaRC-SI material in a thin film form. The PZT piezoelectric ceramic wafer which is electroplated on its two opposing faces is placed on top of the first adhesive layer. A second adhesive layer, also comprising LaRC-SI material or the like, is positioned on top of the ceramic wafer, and a second metal pre-stress layer, which typically comprises aluminum foil or the like, is placed on top of the second adhesive layer thereby completing the "sandwich". As the layers are stacked in the desirable configuration a "dot" of glue is placed between each adjacent layer to prevent slippage of adjacent layers of the "sandwich" during the manufacturing process. Prior THUNDER actuators have been constructed using various numbers of adhesive layers and/or metal pre-stress layers, depending on the desired pre-stressing characteristics.

The "sandwich" building process is repeated until a desirable number of composite structures have been assembled. Each assembled composite structure is placed on a heating tray. The heating tray comprises an aluminum plate, a first layer of fiberglass, and a first layer of release cloth. The first layer of fiberglass is positioned on top of the aluminum plate, and the first layer of release cloth is placed on top of the first layer of fiberglass. The composite structures are positioned on the heating tray, and a second layer of release cloth is placed on the composite structures. A second layer of fiberglass is placed on the second layer of release cloth. A heat resistant sealant tape is disposed around the perimeter of the heating tray to hold the first and second layers of release cloth, the first and second layers of fiberglass and the composite structures in place. A sheet of KAPTON™ as manufactured by the DuPont Company, is placed over the secured heating tray, and the entire assembly is placed in an autoclave. A vacuum line is inserted under the KAPTON sheet; and the KAPTON sheet pulls the composite structures against the heating tray as a vacuum is drawn through the vacuum line.

While in the autoclave, the ceramic wafer, the first and second adhesive layers and the first and second pre-stress layers are simultaneously heated to a temperature above the melting point of the adhesive material (typically several hundred degrees Fahrenheit). Due to the relatively large mass of the autoclave, it may take several hours to heat the entire inner chamber to a sufficient temperature. The temperature is then maintained above the LaRC-SI melting point for approximately an hour. Natural convection currents, set up within the chamber, transfer heat to the individual composite structures. In some situations, if natural convection is not sufficient, forced convection, using fans or pumps are used. After sufficient heating, the autoclave and the composite structures are allowed to cool, thereby re-solidifying and setting the adhesive layers. The cooling process typically takes several hours due to the high temperature within the autoclave. During the cooling process the ceramic wafer becomes compressively stressed, due to the higher coefficient of thermal contraction of the materials of the pre-stress layers than for the material of the ceramic wafer. Also, due to the greater thermal contraction of the laminate materials (e.g. the first pre-stress layer and the first adhesive layer) on one side of the ceramic wafer relative to the thermal contraction of the laminate materials (e.g. the second adhesive layer and the second pre-stress layer) on the other side of the ceramic wafer, the ceramic wafer deforms in an arcuate shape having a normally concave face and a normally convex face.

A strong bond between adjacent layers of a finished THUNDER actuator is critical. This bond is accomplished in the prior art by drawing the KAPTON sheet down onto the composite structures during the heating process using the vacuum line. Nitrogen is injected into the autoclave during the heating process to pressurize the autoclave. The pressure placed on the composite structures by the sheet of KAPTON and the pressurized nitrogen atmosphere, while the LaRC-SI is in a liquid state, aids in pressing the composite structures together and producing a substantial bond between adjacent layers.

Subsequent to cooling the autoclave sufficiently, the heating tray and its contents are removed from the autoclave, and each THUNDER element is then removed from the tray by hand. Each THUNDER element is then electrically polarized at a "poling station" by applying a relatively high voltage potential between the opposing major faces of the THUNDER element. The polarization process in the prior art typically takes approximately two minutes for each individual THUNDER element.

The above described prior THUNDER manufacturing process is time consuming, inefficient, and of relatively low quality as compared to what is achieved in the present invention. In prior THUNDER manufacturing processes tight tolerances cannot be maintained, and quality control is at a minimum. Manual cutting of each layer of the THUNDER device takes a great deal of time and is not as accurate as can be accomplished by machine.

Another problem inherent with this prior method of THUNDER production relates to the use of an autoclave to pressurize and heat the ceramic, adhesive, and metallic materials. An autoclave is not energy efficient because large quantities of heat are required to raise the temperature of the mass of the autoclave to desirable levels. The heating process is time consuming because in order to raise the temperature of a single "sandwich" the entire autoclave chamber must be heated, and the heat must be transferred from the autoclave chamber atmosphere to the KAPTON by convection, and then the heat must be transferred by conduction through the KAPTON (an insulator) to the "sandwich". A comparable amount of time is required to allow the autoclave to cool to a safe temperature before removing the THUNDER devices from the autoclave.

In addition, because of the tendency of the cooling "sandwich" to deform into an arcuate shape (due to the differences in coefficients of thermal expansion of the layers of the "sandwich"), it is necessary to release pressure on the "sandwich" in a controlled manner during the cooling process. It is desirable that the releasing of pressure on the "sandwich" be controlled in accordance with temperature of the "sandwich" as it cools down. However, because of the use of an autoclave to convectively heat (and subsequently cool down) the "sandwich" it is very difficult to determine the exact temperature of the "sandwich" at any given time, unless the autoclave atmosphere is heated up (and cooled down) very slowly.

Furthermore, due to temperature variations from one location to another within the autoclave, the temperature of one "sandwich" may be different from that of another inside of the autoclave. However, because the pressure on all of the "sandwiches" in the autoclave is the same (i.e. corresponding to the chamber atmosphere's pressure), it is not possible to release the pressure on individual THUNDER "sandwiches" at different times in accordance with the respective temperatures of each "sandwich".

Accordingly, it would be desirable to provide a method and apparatus for high volume, high precision, high speed manufacturing of piezoelectric actuators which limits human involvement and maximizes efficiency.

SUMMARY OF THE INVENTION

In view of the foregoing disadvantages inherent in the known methods and devices for manufacturing pre-stressed piezoelectric actuators now present in the prior art, the present invention provides a method and apparatus for manufacturing pre-stressed piezoelectric actuators which maximizes output, and increases the precision and efficiency with which the actuators are made relative to the prior art.

Accordingly, it is a primary object of the present invention to provide a method of the character described for manufacturing piezoelectric actuators which improves upon the prior art.

It is another object of the present invention to provide a method of manufacturing multi-layer piezoelectric actuators.

It is another object of the present invention to provide a manufacturing system for producing multi-layer piezoelectric actuators which is automated.

It is another object of the present invention to provide a method of the character described in which individual continuous tapes are automatically stacked and registered with respect to each other prior to bonding the layers to each other.

It is another object of the present invention to provide a method of the character described in which adjacent layers of the actuators are bonded to each other with an adhesive.

It is another object of the present invention to provide a manufacturing process of the character described which is capable of producing actuators at a high rate.

It is another object of the present invention to provide a manufacturing process of the character described which produces actuators which are pre-stressed.

It is another object of the present invention to provide a manufacturing process of the character described which is capable of producing high deformation arcuate actuators.

It is yet another object of the present invention to provide a manufacturing process of the character described which is highly efficient as contrasted with the prior art.

Further objects and advantages of this invention will become apparent from a consideration of the drawings and ensuing description thereof.

DESCRIPTION OF THE PREFERRED EMBODIMENTS

Figure 10:
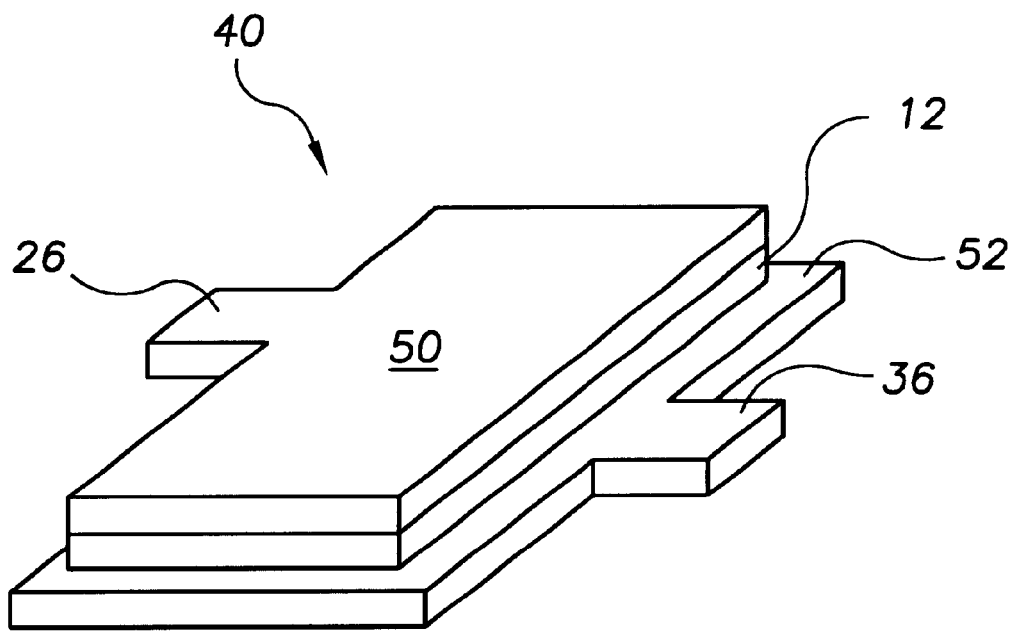
FIG. 10 is a perspective view showing an actuator constructed in accordance with the preferred embodiment of the present invention.

With reference directed toward the appended drawings, a pre-stressed high deformation piezoelectric actuator (generally designated by the reference numeral 40) manufactured embodying the principles and concepts of the present invention will be described. The disclosed manufacturing process can be advantageously employed to produce pre-stressed, multi-layered piezoelectric actuators. As will become apparent from the following disclosure, modifications of the present invention can be used to produce actuators having any number of laminate layers and having a wide range of geometries. However, for the purpose of illustration only, the following disclosure describes a method for manufacturing a pre-stressed high deformation piezoelectric actuator 40 comprising a piezoelectric wafer 12 that is sandwiched between, and bonded to, a pair of metal pre-stressing layers 50 and 52 as shown in FIG. 10. The manner by which the pre-stressing layers 50 and 52 are bonded to the piezoelectric wafer 12 (i.e. by a thermoplastic copolyimide having a high melting point) causes the piezoelectric wafer 12 to become normally compressively stressed ("pre-stressed") at typical ambient temperatures.

Figure 7:
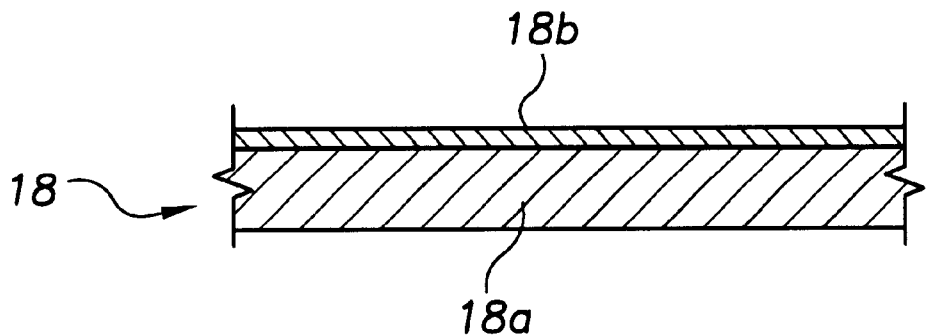
FIG. 7 is a cross-sectional elevational view showing the details of construction of a first metal tape constructed in accordance with the preferred embodiment of the present invention.
Figure 8:
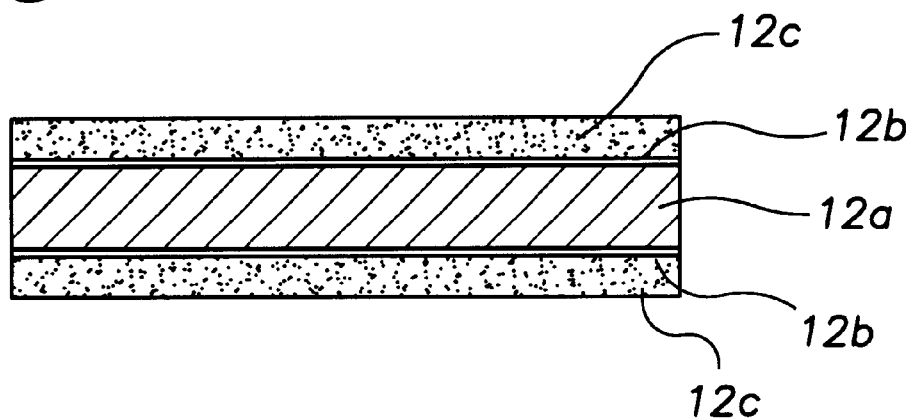
FIG. 8 is a cross-sectional elevational view showing the details of construction of a piezoelectric wafer manufactured in accordance with the preferred embodiment of the present invention.
Figure 9:
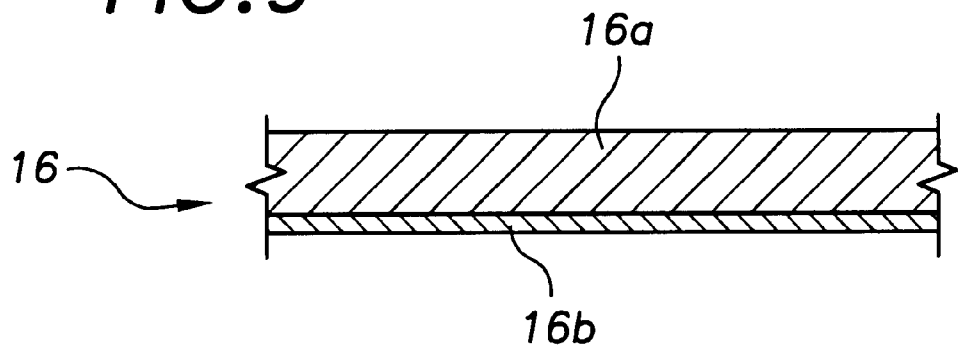
FIG. 9 is a cross-sectional elevational view showing the details of construction of second metal tape constructed in accordance with the preferred embodiment of the present invention.

As will be described more fully herein below, in the preferred embodiment of the invention the multi-layered actuators 40 is produced by sandwiching a number of discrete piezoelectric wafers 12 between a pair of metal tapes 16 and 18, then subsequently conducting operations upon the assembly to produce discrete actuator devices 40. The piezoelectric wafers 12 each comprise a PZT ceramic wafer 12a having two opposing major faces which are electroplated 12b, as illustrated in FIG. 8. Each of the electroplated surfaces 12b are preferably coated with a "primer" coat of adhesive 12c, as illustrated in FIG. 8. Each of the metal tapes 16 and 18 comprise a metal layer 16a and 18a, respectively, and an adhesive layer 16b and 18b, respectively, as shown in FIGS. 9 and 7. The end product of the disclosed preferred manufacturing process is a piezoelectric actuator, generally indicated 40, in which a piezoelectric wafer 12 is bonded to, and disposed between a first prestress layer 50 and a second prestress layer 52, as illustrated in FIG. 10.

Figure 2:
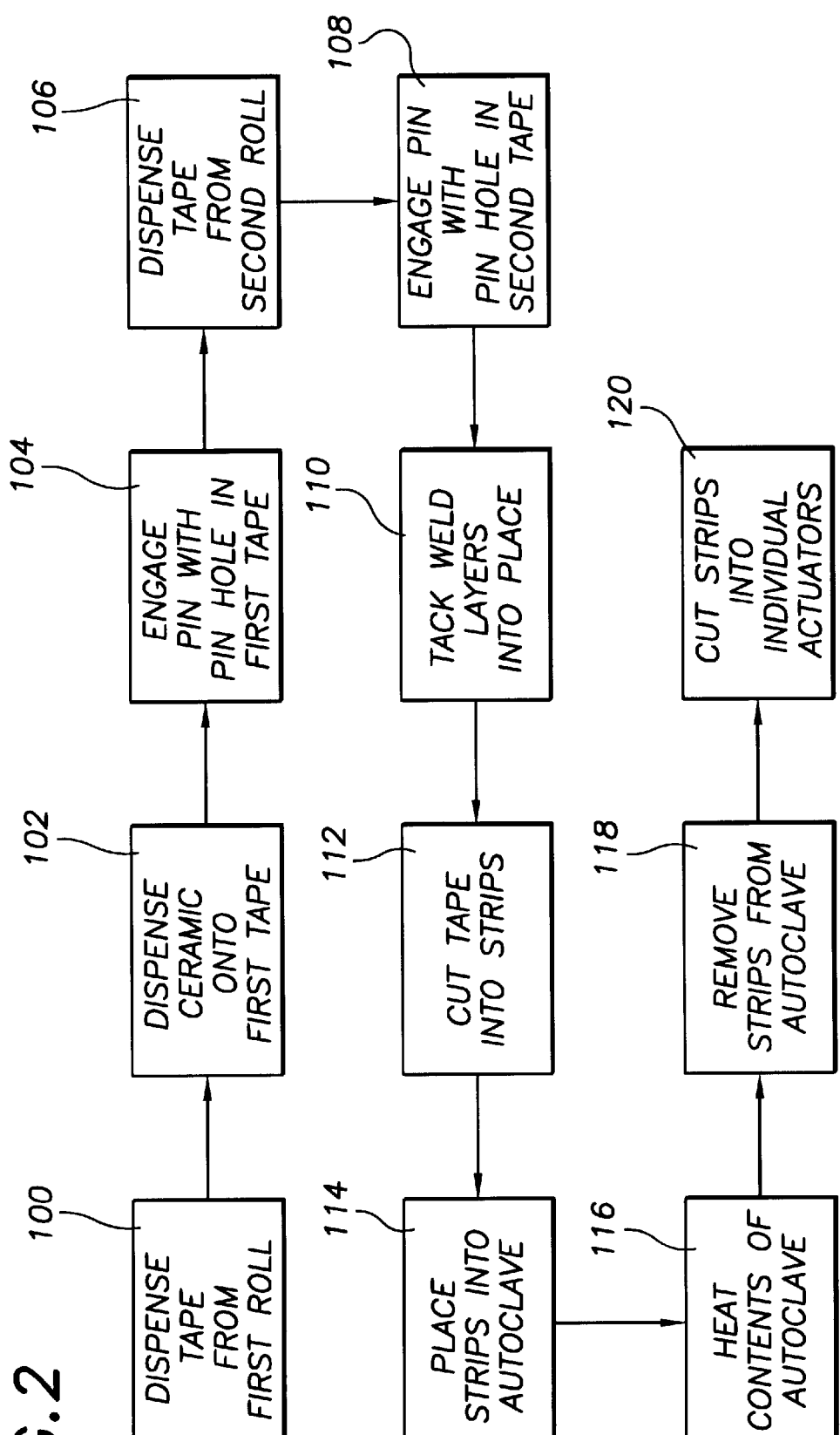
FIG. 2 is a schematic flow diagram showing a method of manufacturing piezoelectric actuators in accordance with the preferred embodiment of the present invention.

Steps involved in manufacturing a piezoelectric actuator in accordance with the preferred embodiment of the present invention are shown in FIG. 2, with individual steps denoted by three-digit reference indicia. Physical elements of the invention are designated by two-digit reference indicia in the Figures.

The first step in the preferred embodiment of the present invention is to dispense 100 a first metal tape 18, which comprises a metal layer 18a, typically aluminum, brass stainless steel or other metal, and an adhesive layer 18b, from a first roll 14. In the preferred embodiment of the invention, the adhesive layer 18b, preferably LaRC-SI, is pre-coated on one side of the first metal tape 18. The adhesive layer 18b may be applied by flame-spraying, powder coating, or any other coating process known to those skilled in the art. The first roll 14 is rotatably supported by a roll support member 11, such that the tape 18 may be continuously drawn from the rotating roll. The first metal tape 18 is stamped, prior to being put on the first roll 14, using a die or the like, into a predetermined shape which will be described more fully herein below.

After the first metal tape 18 is dispensed 100 from the first roll 14, the metal tape 18 is passed under a piezoelectric ceramic dispenser 20. The piezoelectric ceramic dispenser 20 dispenses 102 piezoelectric wafers 12 onto the coated side of the first metal tape 18 at predetermined intervals. The piezoelectric wafers 12 each preferably comprise a wafer-shaped piezoelectric ceramic layer 12a having electrodes 12b on its two major faces and having an adhesive layer 12c coating each of the electroded surfaces 12b, as illustrated in FIG. 8. The piezoelectric wafers 12 are dispensed 102 onto thin metal members 28 which are part of the first metal tape 18. The first metal tape 18 then approaches an alignment mechanism 23 which comprises a series of pins 22 extending from an endless moving track 24.

Figure 3:
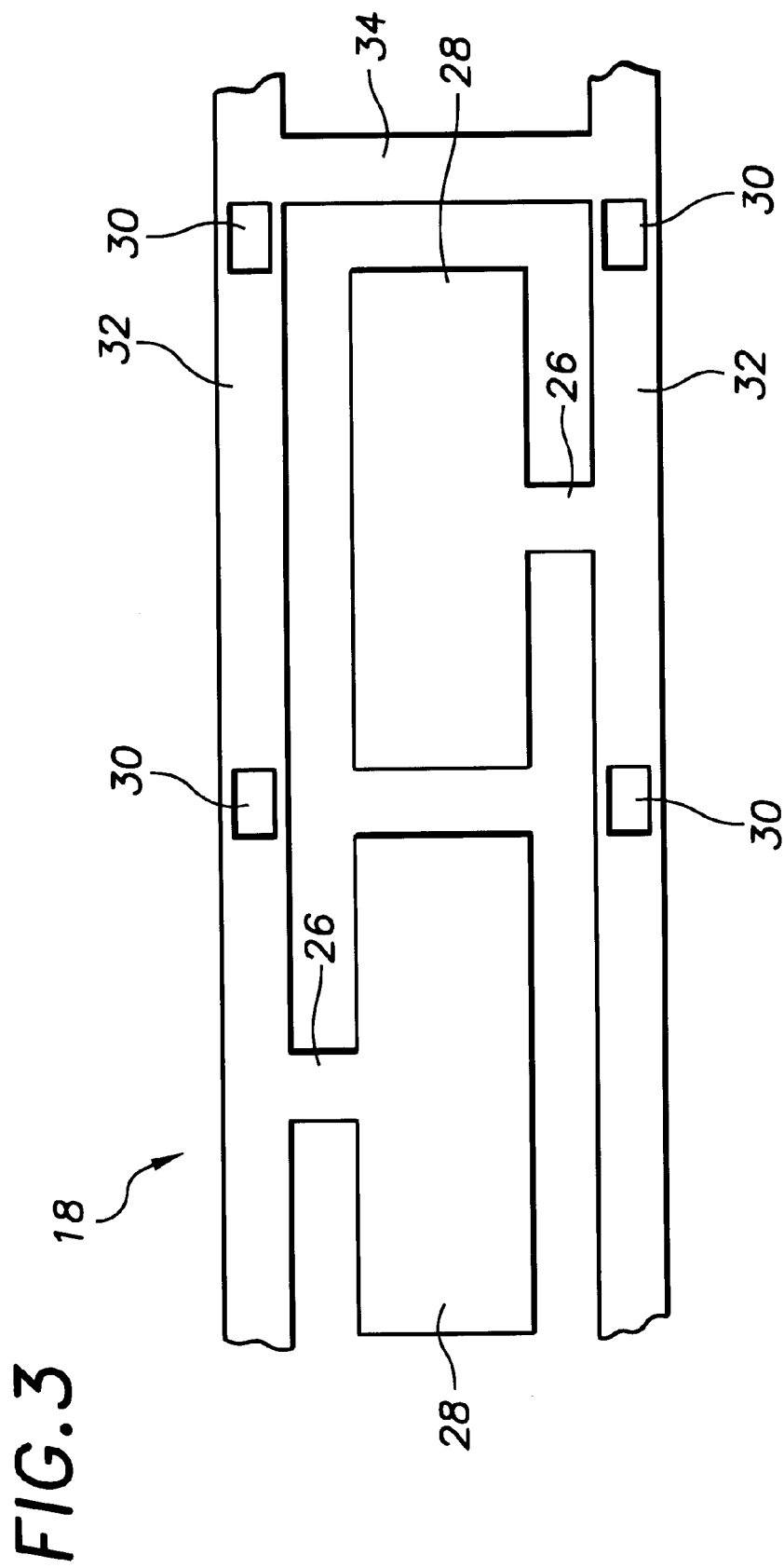
FIG. 3 is a plan view of the first metal tape constructed in accordance with the preferred embodiment of the present invention.

As shown in FIG. 3, the first metal tape 18 (as well as a second metal tape 16) is stamped into a predetermined shape. The tape 16 comprises a series of thin metal members 28 which are connected, via a tab 26, to outer guide members 32a and 32b. In the preferred embodiment of the invention, the thin metal members 28 are formed in a rectangular shape. The tab 26 extends from an edge of the thin metal member 28 to one of two outer guide members 32a and 32b. As shown in FIG. 3, each successive tab 26 alternates from which guide member 32a and 32b it extends.

For example, in a continuous sequence of thin metal members 28, the tab 26 on the first, third and fifth, thin metal members 28 in a tape may extend to one outer guide member 32a, while the tab 26 on the second, fourth, and sixth thin metal members 28 of the same tape may extend to the other outer guide member 32b. The advantage of having the tabs 26 extend from alternating sides of the thin metal member 28 will be explained more fully herein below. Extending from one outer guide member 32a to the other outer guide member 32b at predetermined intervals is a connection member 34, which holds the outer guide members 32a and 32b, and their attachments, together, and in alignment relative to one another.

Located at predetermined intervals along each of the outer guide members 32a and 32b are pin holes 30. The pin holes 30 are designed for engagement with a series of pins 22 which aid in the alignment/registration of the first metal tape 18 with the dispensed piezoelectric wafers 12 and the second metal tape 16. In the preferred embodiment of the invention, the pin holes 30 and pins 22 are rectangular in cross-section, however in alternative embodiments of the present invention the pin holes 30 and pins 22 may be square, circular, triangular or any other shape in cross-section. In any one embodiment of the invention the pin holes 30 and pins 22 do not necessarily have to be the same shape, however the cross-section of the pin holes 30 must be such that the pins 22 can engage the pin holes 30.

Figure 1:
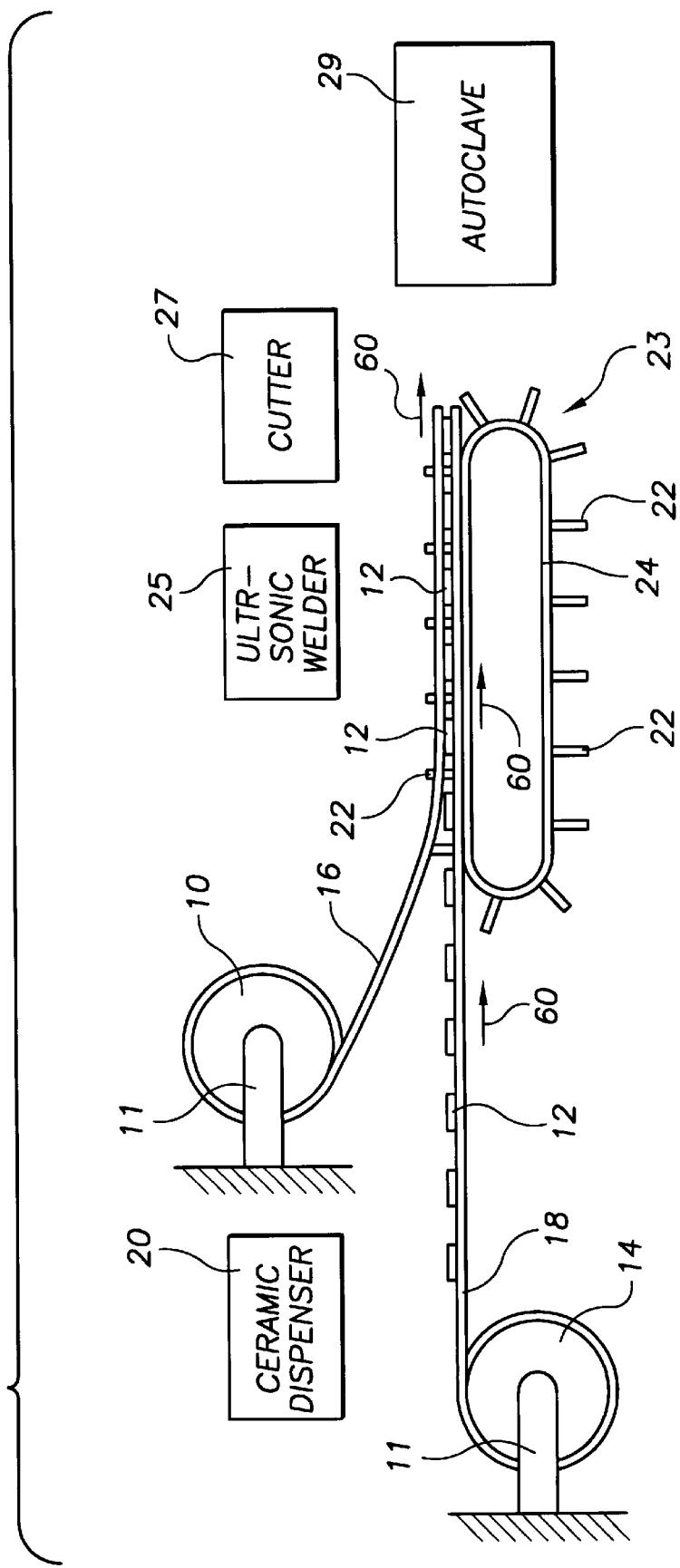
FIG. 1 is a schematic side elevation of an apparatus for manufacturing high deformation piezoelectric actuators made in accordance with the preferred embodiment of the present invention.

Again referring to FIGS. 1 and 2: As the first metal tape 18 approaches the alignment mechanism 23 a pair of pins 22 which are aligned with a pair of pin holes 30 engage 104 the pin holes 30. At about the same time, the second metal tape 16 is dispensed 106 from a second roll 10, which is also supported by a roll support member 11. As the second metal tape 16 approaches the alignment mechanism 24 the same pin 22 engages 104 the pin hole 30 in the first metal tape 18, engages 108 a pin hole 30 in the second metal tape 16, with the coated side of the second metal tape opposing the coated side of the first metal tape 18, thereby forming a three layer composite consisting of the first metal tape 18 and the second metal tape 16, with a piezoelectric wafer 12 disposed therebetween.

Figure 4:
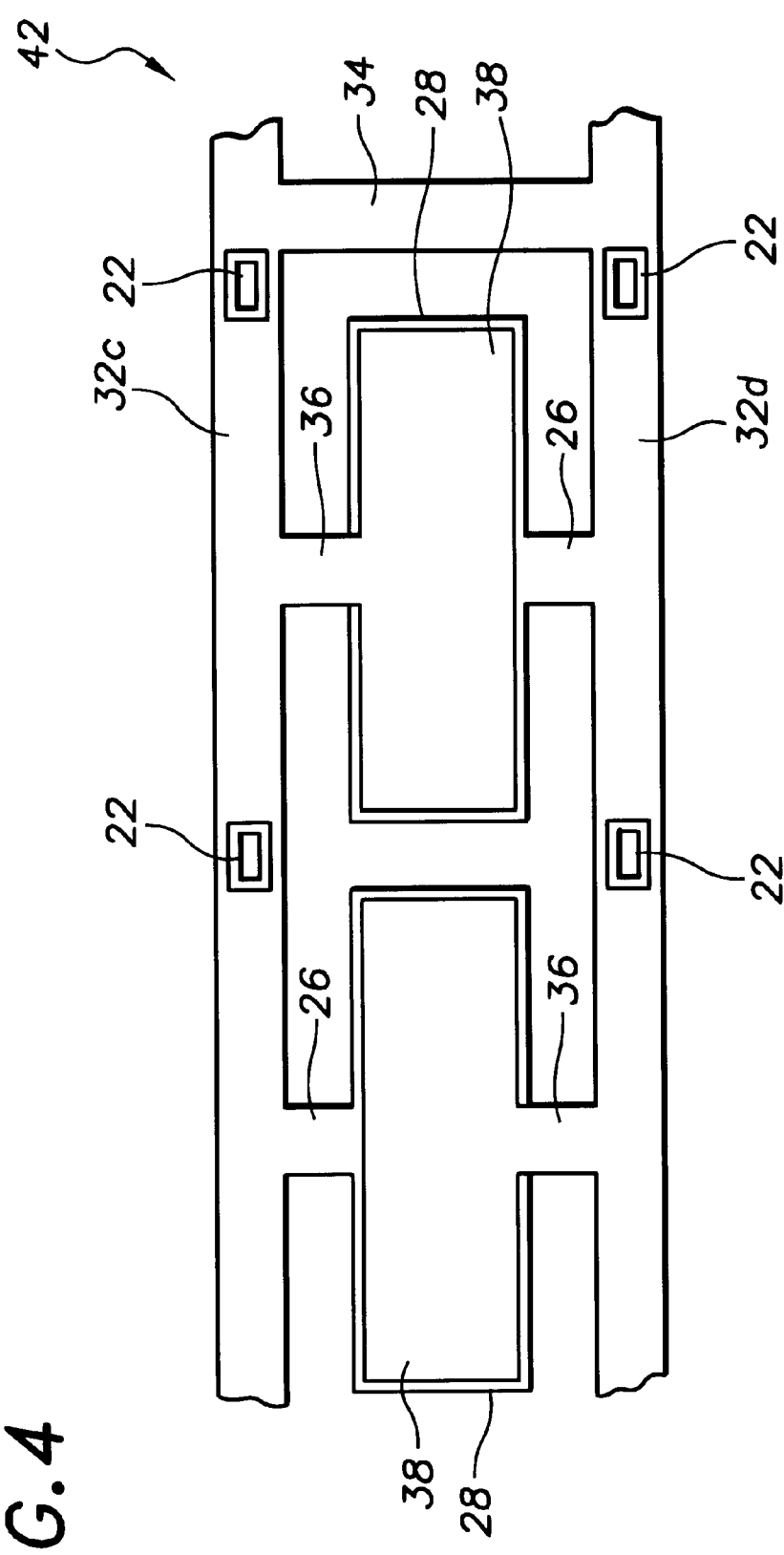
FIG. 4 is a plan view of the composite tape constructed in accordance with the preferred embodiment of the present invention.

Referring now to FIG. 4: In the preferred embodiment of the present invention, the second metal tape 16 has tabs 36 extending from the thin metal members 38 on the opposite side as the corresponding tabs 26 extending from the thin metal members 28 on the first metal tape 18. The thin metal members 38 on the second metal tape 16 are preferably slightly smaller (in length and width) than the thin metal members 28 on the first metal tape 18, such that the thin metal members 38 of the second metal tape 16 fit "concentrically" (i.e. evenly within the perimeter) upon the thin metal members 28 of the first metal tape 18, thereby exposing a border of the first metal tape 18 around the second metal tape 16. The pin holes 30 in the first metal tape 18 and the pin holes 30 in the second metal tape 16 are designed with tolerances such that a pin 22 can be inserted into each corresponding set of pin holes 30 as the process is carried out. In the preferred embodiment of the invention, on the first and second metal tapes 16 and 18 there are substantially the same number of pin holes 30 along the outer guide members 32a, 32b, 32c and 32d as there are thin metal members 28 and 38, and at the same spacing. It should be understood that the pin holes 30 on the first and second metal tapes 16 and 18 may be located at any point along the outer guide member 32a, 32b, 32c and 32d, and at any spacing.

In the preferred embodiment of the present invention, the track 24 travels linearly (as indicated by arrows 60) with the tapes 16 and 18, such that the pins 22 engage the pin holes 30 as the first and second metal tapes 16 and 18 are dispensed 100 and 106 from the first and second rolls 10 and 14 onto the track 24.

The composite tape 42 is then passed to an ultrasonic welder 25, which intermittently ultrasonically tack welds 110 the composite tape 42 together with high frequency vibrations by melting the adhesive material 16b and 18b on the coated side of the first and second metal tapes 16 and 18, respectively. This is accomplished by vibrating the area to be welded at an ultrasonic frequency thereby elevating the temperature of the area to be welded above the melting temperature of the adhesive material.

Figure 6:
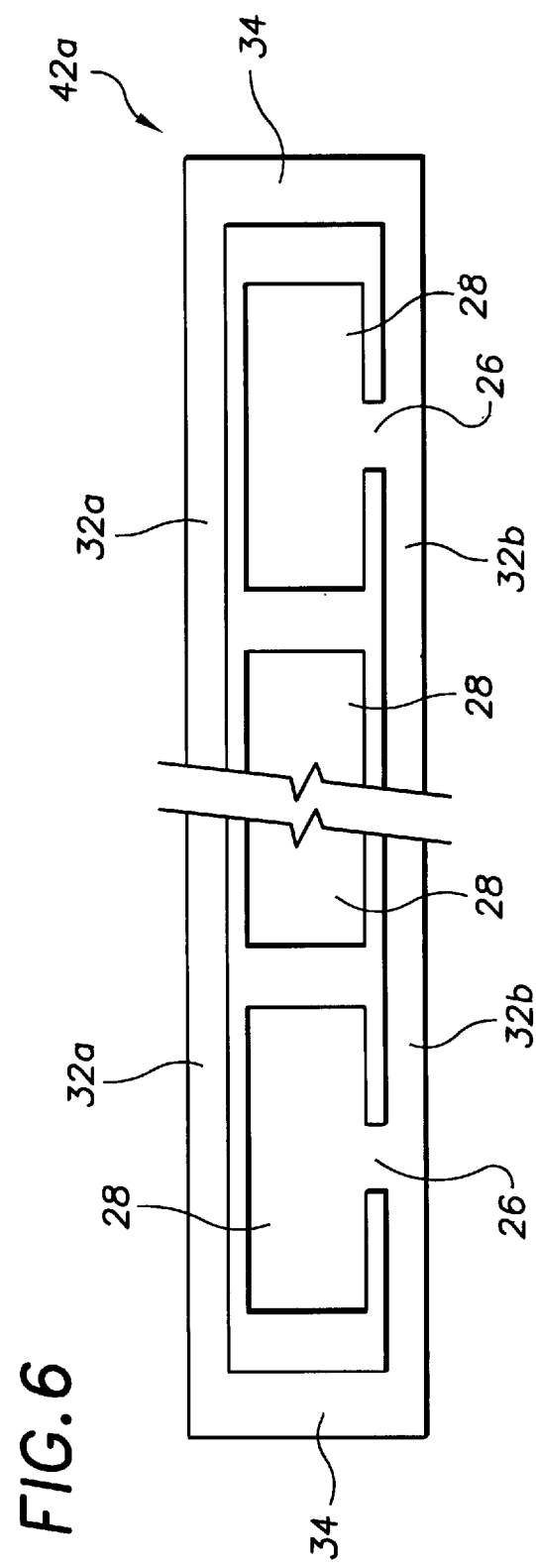
FIG. 6 is a bottom view of a composite strip constructed in accordance with the preferred embodiment of the present invention.

In the preferred embodiment of the present invention, the composite tape 42 is then passed to a cutter 27. The cutter 27, using a blade, saw or the like, cuts 112 or severs the composite tape 42 into smaller composite strips 42a of a predetermined length which are easier to handle than a continuous composite tape 42 as shown in FIG. 6.

A predetermined number of composite strips 42a are then placed 114 in an autoclave 29. In the autoclave 29, the components of the composite strips 42a are simultaneously heated 116 to a temperature above the melting point of the adhesive material, and then subsequently allowed to cool, thereby re-solidifying and setting the adhesive material. During the cooling process the piezoelectric wafer 12 becomes compressively stressed, due to the higher coefficient of thermal contraction of the material of the first metal tape 18 than for the material of the piezoelectric wafer 12. Also, due to the greater thermal contraction of the laminate materials (e.g. the first metal tape 18 and the adhesive material) on one side of the piezoelectric wafer 12 relative to the thermal contraction of the laminate material(s) (e.g. the second metal tape 16 and the adhesive material) on the other side of the piezoelectric wafer 12, the piezoelectric wafer deforms in an arcuate shape having a normally concave face 40a and a normally convex face 40c, as illustrated in FIG. 5.

Figure 5:
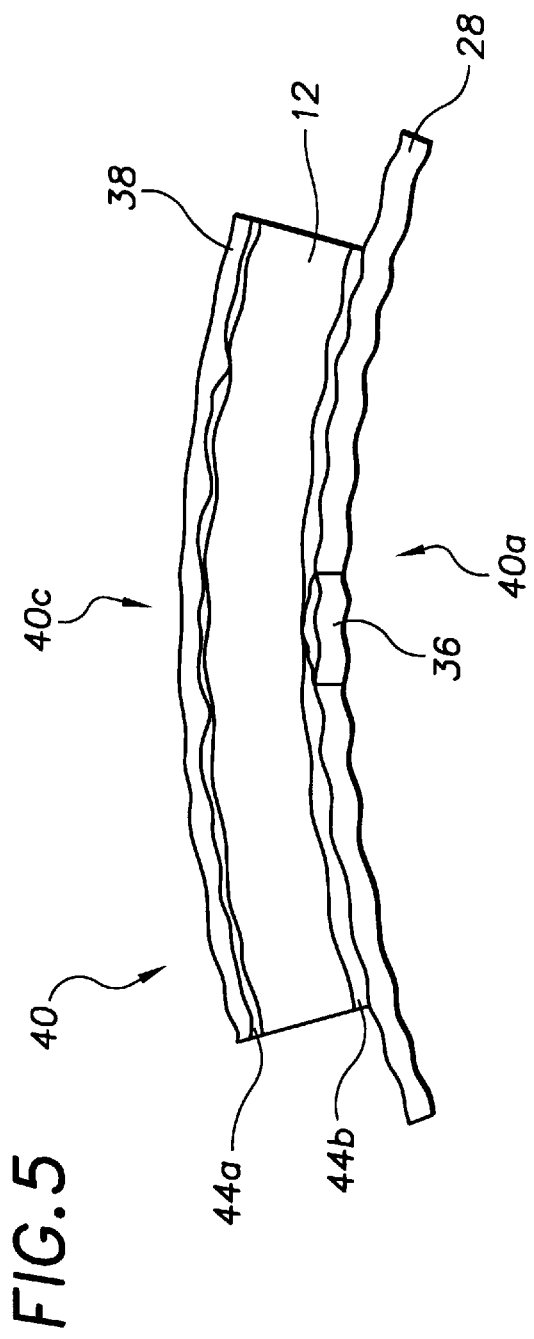
FIG. 5 is a side elevation of a high deformation piezoelectric actuator constructed in accordance with the present invention.

The composite strips 42a are then removed 118 from the autoclave 29, and cut into individual actuators 40 as shown in FIGS. 5 and 10. In the preferred embodiment of the invention, the actuator 40 comprises a top thin metal member 28, a first adhesive layer 44a, a piezoelectric wafer 12, a second adhesive layer 44b, and a bottom thin metal member 38. In the preferred embodiment of the invention, the composite strips 42a are cut 120 transversely across the area where the tabs 26 and 36 are attached to the outer guide members 32a, 32b, 32c and 32d thereby forming individual actuators 40, as illustrated in FIG. 10, with tabs 26 and 36 advantageously extending from the top thin metal member 38 and the bottom thin metal member 28 for connection of electrical leads (not shown) thereto. In an alternative embodiment of the invention, the composite strips 42a may be cut 120 transversely across the area where the tabs 26 and 36 are attached to the thin metal members 28 and 38.

In the foregoing disclosure the relative orientations of the first and second metal tapes 16 and 18, and the composite tape 42 are described consistently with their respective orientations illustrated in the accompanying drawing figures. Thus the first metal tape 18 may be referred to as being passed "under" the ceramic dispenser 102, and the composite tape 42 may be referred to as being passed "under" the ultrasonic welder 25 and the cutter 27, and the lengths of the component layers of the composite tape 42, namely the first metal tape 18, the piezoelectric wafer 12 and the second metal tape 16, are shown in the figures as being nominally horizontally oriented. However, it is within the scope of the present invention to orient the composite tape 42 and its components in any number of various other positions with respect to horizontal, and with respect to the other components of the present invention.

As described above, and as schematically illustrated in FIG. 2, the preferred process for manufacturing actuators 40 in accordance with the present invention comprises the following sequential steps: Dispense 100 first tape (18); dispense 102 ceramic (12); engage 104 pins (22) with pin holes (30) in first tape (18); dispense 106 second tape (16); engage 108 pins (22) with pin holes (30) in second tape (16); tack weld 110 composite tape (42); cut 112 composite tape (42) into strips (42*a*); place 114 strips (42*a*) into autoclave (29); heat 116 contents of autoclave (29); remove 118 strips (42*a*) from autoclave (29); and cut 120 strips (42*a*) into individual actuators (40). It is, however, within the scope of the present invention to modify the sequence of steps from that of the preferred embodiment. For example, it is within the scope of the present invention to cut 120 the strips (42*a*) into individual composite structures before heating 116 the contents of the autoclave (29).

While the above description contains many specificities, these should not be construed as limitations on the scope of the invention, but rather as an exemplification of one embodiment and a few modifications thereof. Many other variations are possible, for example:

- Adhesives, preferably polyimides, other than LaRC-SI which melt below the Curie temperature of the ceramic layer, have strong bonding capabilities, high flexural strength and prestress the piezoelectric wafer upon cooling, may be used to bond adjacent layers of the actuators together;
- Any combination of metal tapes, adhesive layers and piezoelectric wafers may be used to fabricate a composite tape, and ultimately an actuator;
- Instead of coating the first and second metal tapes 18 and 16 with adhesive material, adhesive layers, in the form of thin deformable tapes that are similar in shape to that of the first and second metal tapes 18 and 16, may be dispensed separately between the first metal tape 18 and the piezoelectric wafer 12, and the second metal tape 16 and the piezoelectric wafer 12 during the present process;
- Instead of coating the first and second metal tapes 18 and 16 with adhesive material, adhesive layers, in the form of individual thin deformable sheets may be disposed between the thin metal member 28 of the first metal tape 18 and the piezoelectric wafer 12, and the thin metal member 38 of the second metal tape 16 and the piezoelectric wafer 12 during the present process;
- The piezoelectric wafer 12 may be coated on its two major faces with an adhesive material prior to being dispensed onto the first metal tape 18;
- The first and second metal tapes may be coated with adhesive material subsequent to being dispensed from the first or second roll, using a coating process such as flame-spraying, powder coating or the like;
- The composite strips or individual composite structures may be pressed and heated by heated press members instead of being placed in the autoclave;
- The composite strips or individual composite structures may be pressed and heated by heated rollers instead of being placed in the autoclave;
- Additional thin metal members may be added or omitted in order to increase or decrease the stress in the piezoelectric wafer or to affect the strength of the entire actuator 40;
- The actuators may be polarized subsequent to the process described in the preferred embodiment of the invention;
- The thin metal members and the piezoelectric wafers may be of various other geometric shapes besides rectangular as described above;
- The piezoelectric wafers may be dispensed onto the first metal tape using a carousel, robotic arm, or other similar placement means;
- The first and second metal tapes may be stamped subsequent to being dispensed from the first or second roll;
- The composite strips or individual composite structures may be placed on a tray or the like, covered and have a vacuum drawn upon them prior to being placed in the autoclave;
- The tabs 26 and 36 may be split or dimpled for electrical lead connection thereto; and
- The composite strips and or composite structures may be heated in another type of oven besides an autoclave, such as a tunnel kiln.

Accordingly, the scope of the invention should be determined not by the embodiment illustrated, but by the appended claims and their legal equivalents.

What is claimed is:

1. A method of constructing a piezoelectric device, comprising the steps of:
   - dispensing a first tape onto a moveable track;
     - said first tape having a plurality of spaced apart pinholes therethrough engageable with a plurality of spaced apart pins on said moveable track;
   - dispensing a first ceramic onto said first tape;
   - dispensing a second tape onto said first ceramic;
     - said second tape having a plurality of spaced apart pinholes therethrough engageable with a plurality of spaced apart pins on said moveable track;
   - securing said first tape to said second tape to form a composite tape;
   - increasing a temperature of said composite tape;
   - decreasing a temperature of said composite tape;
   - and cutting said composite tape to form at least one piezoelectric device.

2. The method of claim 1;
   - wherein said step of dispensing said first tape comprises dispensing a tape comprising a metal layer and an adhesive layer;
   - and wherein said step of dispensing a ceramic onto said first tape comprises dispensing a ceramic onto said adhesive layer of said first tape.

3. The method of claim 1;
   - wherein said step of dispensing said second tape comprises dispensing a tape comprising a metal layer and an adhesive layer;
   - and wherein said step of dispensing a second tape onto said ceramic comprises dispensing said adhesive layer of said second tape onto said ceramic.

4. The method of claim 1, further comprising:
   - dispensing a second ceramic onto said first tape after said step of dispensing said first ceramic onto said first tape;
   - wherein said step of dispensing said second tape onto said first ceramic further comprises dispensing said second tape onto said second ceramic.

5. The method of claim 1, wherein said step of increasing a temperature of said composite tape comprises the steps of:
   - placing said composite tape into an autoclave;

and raising a temperature of said autoclave;

and wherein said step of decreasing a temperature of said composite tape comprises the step of decreasing a temperature of said autoclave.

6. The method of claim 1, wherein said step of increasing a temperature of said composite tape comprises the steps of:

placing said composite tape into an autoclave;

and raising a temperature of said autoclave;

and wherein said step of decreasing a temperature of said composite tape comprises the removing said composite tape from said autoclave.

7. The method of claim 1, further comprising the step of:

cutting said composite tape into strips before said step of increasing said temperature of said composite tape.

* * * * *